United States Patent
Ohashi

[19]

[11] Patent Number: 6,107,874
[45] Date of Patent: Aug. 22, 2000

[54] SEMICONDUCTOR INTEGRATED CIRCUIT DEVICE PRODUCED FROM MASTER SLICE AND HAVING OPERATION MODE EASILY CHANGEABLE AFTER SELECTION ON MASTER SLICE

[75] Inventor: Masayuki Ohashi, Tokyo, Japan

[73] Assignee: NEC Corporation, Tokyo, Japan

[21] Appl. No.: 09/012,189

[22] Filed: Jan. 23, 1998

[30] Foreign Application Priority Data

Jan. 23, 1997 [JP] Japan ..................................... 9-010651

[51] Int. Cl.[7] ................................................. H01L 25/00
[52] U.S. Cl. ........................... 327/565; 327/407; 327/566
[58] Field of Search .................................... 327/564–566, 327/407; 326/37–39

[56] References Cited

U.S. PATENT DOCUMENTS

| | | | |
|---|---|---|---|
| 4,446,390 | 5/1984 | Alaspa | 327/407 |
| 5,113,093 | 5/1992 | Tashiro et al. | 326/38 |
| 5,504,439 | 4/1996 | Tavana | 326/38 |
| 5,764,075 | 6/1998 | Fukushima | 326/38 |
| 5,880,596 | 3/1999 | White | 326/38 |

FOREIGN PATENT DOCUMENTS

| | | |
|---|---|---|
| 0742589 | 11/1996 | European Pat. Off. . |
| 62-185357 | 8/1987 | Japan . |
| 2-177364 | 7/1990 | Japan . |
| 4-17356 | 1/1992 | Japan . |
| 5-41644 | 2/1993 | Japan ..................................... 327/407 |
| 8-22694 | 1/1996 | Japan . |

*Primary Examiner*—Kenneth B. Wells
*Attorney, Agent, or Firm*—Sughrue, Mion, Zinn, Macpeak & Seas, PLLC

[57] ABSTRACT

A semiconductor integrated circuit device is responsive to a potential level applied to a signal pad connected to a mode changer, and the mode changer causes a mode selector to change a control signal between a first level indicative of a certain combination of sub-circuits of a main circuit selected before separation of the semiconductor chip from a master slice and a second level indicative of another combination of the sub-circuits not selected by a customer; when the manufacturer evaluates the semiconductor integrated circuit device, the manufacturer changes the potential level at the signal pad, and carries out a test for the certain combination and another combination; when the semiconductor chip is sealed in a package, the signal pad is electrically isolated from a source of potential level, and the control signal is fixed to the first level.

11 Claims, 4 Drawing Sheets

SEMICONDUCTOR INTEGRATED CIRCUIT DEVICE PRODUCED FROM MASTER SLICE AND HAVING OPERATION MODE EASILY CHANGEABLE AFTER SELECTION ON MASTER SLICE

FIELD OF THE INVENTION

This invention relates to a semiconductor integrated circuit device and, more particularly, to a semiconductor integrated circuit device the operation mode of which is changeable after selection on the master slice.

DESCRIPTION OF THE RELATED ART

A semiconductor wafer called a "master slice" is branched into different semiconductor integrated circuit devices, and the functions of these semiconductor integrated circuit devices are hereinbelow referred to as "modes of operation". The manufacturer designs the master slice in accordance with customer's option, and branches the master slice into a certain semiconductor integrated circuit device through diffusing steps and/or a bonding step. It is desirable for the manufacturer to fix the semiconductor integrated circuit device to one of the modes of operation as late as possible, since the date of delivery is shortened, the option at the bonding step is more appropriate than the option at the diffusing step. The option at the bonding step is hereinbelow referred to as "bonding option".

FIG. 1 illustrates the bonding option. Reference numeral 1 designates a semiconductor bare chip separated from the master slice, and bonding pads 2, 3 and 4 are formed on the semiconductor bare-chip 1. Though not shown in FIG. 1, the bonding pads 2/3/4 are respectively connected to a signal generator producing an internal control signal representative of the modes of operation. The bonding pads 2 to 4 are selectively connected to a lead terminal 5 assigned to a power potential and a lead terminal 6 assigned to a ground potential through bonding wires 7, 8 and 9. The potential level at the bonding pad 2 is indicative of customer's option at a first mode MOD1, the potential level at the bonding pad 3 is indicative of the option at a second mode MOD2, and the potential level at the bonding pad 4 is indicative of the option at a third mode MOD3. Thus, the customer can select one of the eight modes of operation, i.e., $2^3$, and the manufacturer selectively connects the bonding wires 7/8/9 between the lead terminals 5/6 and the bonding pads 2/3/4 depending upon the customer's options. In this instance, the bonding pads for the customer's option is increased together with the modes of operation. However, the manufacturer reduces the area assigned to each semiconductor chip, and simplifies the lead frame. In this situation, it becomes impossible to select the mode of operation by connecting the bonding pads to the different sources of potential level. For this reason, the manufacturer transfers some bonding options to the diffusing steps, and achieves customer's option through both diffusing/bonding steps.

The customer's option at the diffusing step makes the evaluation on the master slice in different modes of operation impossible, and is less desirable for the semiconductor manufacturer. Japanese Patent Publication of Unexamined Application No. 4-17356 proposes to insert a switching circuit in parallel to a series of inverters, and a control signal is produced upon entry into a test mode. The control signal causes the switching circuit to turn on so as to provide a bypass for a signal. While the semiconductor device is subjected to the test, the switching circuit propagates the signal, and accelerates the test operation. Thus, the switching circuit changes the circuit configuration between the test mode and an actual operation mode.

Japanese Patent Publication of Unexamined Application No. 8-22694 discloses a mode selecting technology using a fuse circuit. The Japanese Patent Publication of Unexamined Application proposes to break a fuse element depending upon customer's option so as to change a semiconductor device between a dynamic random access memory device with a self-refresh mode and a dynamic random access memory device without a self-refresh mode.

The prior art technology disclosed in Japanese Patent Publication of Unexamined Application No. 4-17356 requires a test mode entry circuit for changing a mode of operation, and the manufacturer needs to add a suitable program sequence for the entry into the test mode. The test mode entry circuit occupies a substantial amount of real estate, and the semiconductor chip is enlarged. Moreover, the modification of the test program consumes a large amount of time and labor. Thus, the first prior art technology increases the production cost of the semiconductor integrated circuit device.

Another problem inherent in the first prior art technology is that the current operation mode is hardly confirmed. Moreover, there is a possibility to unintentionally change the operation mode. Thus, the first prior art technology is less reliable.

On the other hand, the second prior art technology requires a fuse breaking apparatus for changing the mode of operation. If the manufacturer fixes the semiconductor device to either dynamic random access memory device, the option is never changeable.

SUMMARY OF THE INVENTION

It is therefore an important object of the present invention to provide a reliable semiconductor integrated circuit device produced from a master slice the operation mode of which is economically changeable after selection of operation mode on the master slice without unintentional entry into a different operation mode.

In accordance with one aspect of the present invention, there is provided a semiconductor integrated circuit device fabricated on a semiconductor chip separated from a master slice and comprising a main circuit formed in a first area of the semiconductor chip and responsive to a first control signal so as to form an electric circuit from certain sub-circuits selected from a plurality of sub-circuits, a plurality of first signal pads formed in the first area, and connected to the main circuit so as to supply an input signal to and receive an output signal from the electric circuit, a mode selector completed in the first area before the separation from the master slice for producing the first control signal representative of the certain sub-circuits and responsive to a second control signal for changing the first control signal, and a mode changer connected to the mode selector and responsive to an instruction supplied from the outside thereof after the separation from the master slice so as to supply the second control signal to the mode selector.

BRIEF DESCRIPTION OF THE DRAWINGS

The features and advantages of the semiconductor integrated circuit device will be more clearly understood from the following description taken in conjunction with the accompanying drawings in which.

DESCRIPTION OF THE PREFERRED EMBODIMENT

Figure 1:
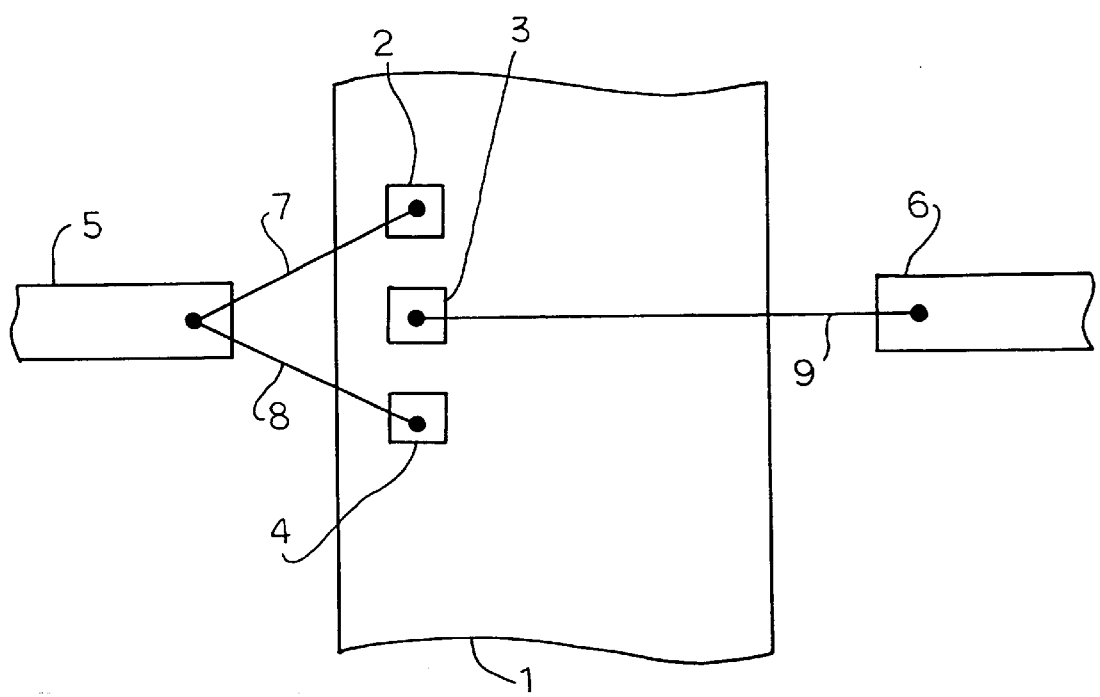
FIG. 1 is a plan view showing the prior art bonding option.
Figure 2:
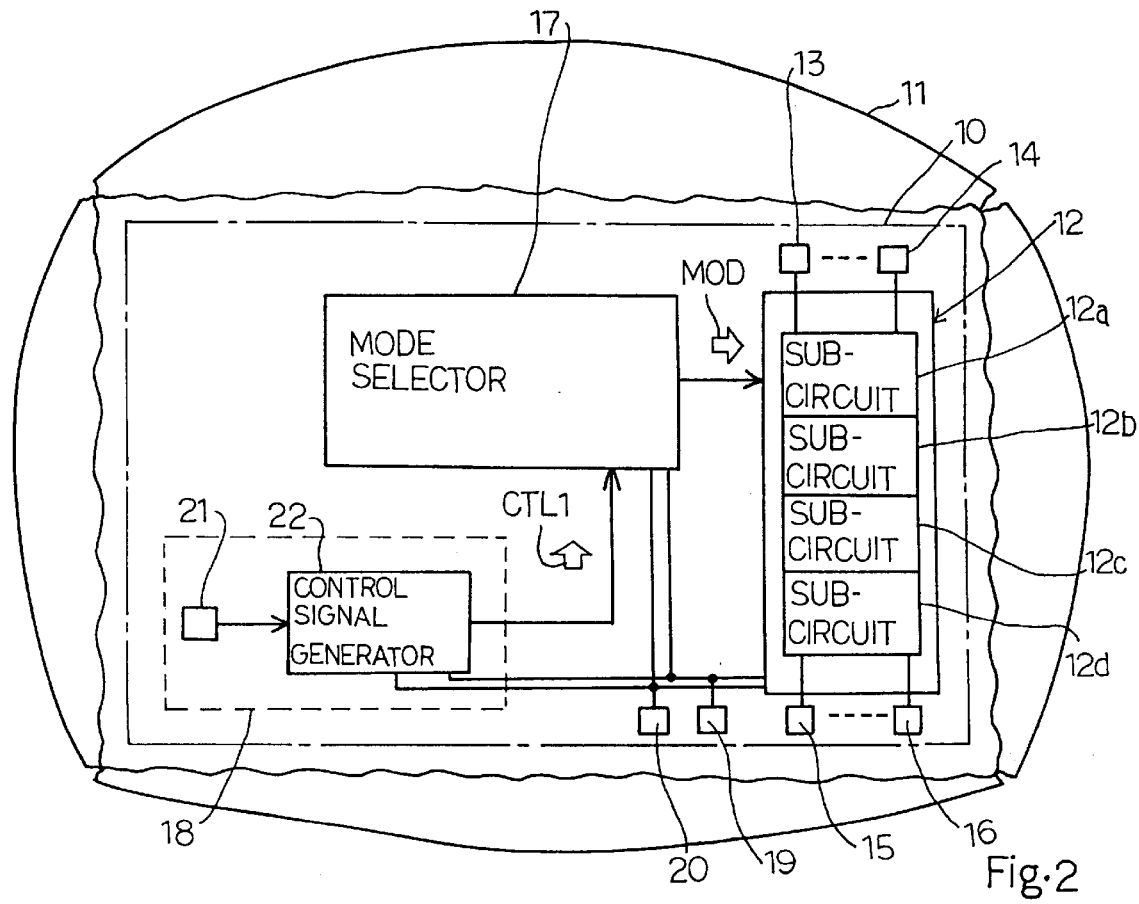
FIG. 2 is a block diagram showing the arrangement of a semiconductor integrated circuit device according to the present invention.

Referring to FIG. 2 of the drawings, a semiconductor integrated circuit device embodying the present invention is fabricated on a semiconductor chip 10 separated from a master slice 11, and comprises a main circuit 12 associated with input signal pads 13 to 14 and output signal pads 15 to 16, a mode selector 17 for producing a control signal MOD representative of a selected operation mode, a mode changer 18 for producing a control signal CTL1 and power supply pads 19 and 20 connected to the main circuit 12, the mode selector 17 and the mode changer 18. Though not shown in the drawings, the input signal pads 13 to 14 and the output signal pads 15 to 16 are connected to lead terminals of a lead frame, and the semiconductor chip 10 and the lead frame are sealed in a suitable package. A positive power voltage Vdd and the ground voltage are supplied to the power supply pads 19 and 20, respectively, and are distributed to the main circuit 12, the mode selector 17 and the mode changer 18.

The main circuit 12 includes various sub-circuits 12a, 12b, 12c and 12d selectively available for a function requested by a customer. The selected sub-circuits 12a–12d are activated with the control signal MOD, and form an electric circuit. The electric circuit produces output signals from input signals at the input signal pads 13 to 14, and supplies the output signals to the output signal pads 15 to 16. There are different combinations of sub-circuits 12a to 12d, and the function of each combination is referred to as "operation mode". If the selected sub-circuits are changed, the electric circuit changes its function, and, accordingly, the semiconductor integrated circuit device behaves in another operation mode. Thus, the main circuit has different operation modes, and enters into a selected operation mode depending upon the potential level of the control signal MOD.

The mode selector 17 determines the potential level of the control signal MOD for a commercial product, and is responsive to the control signal CTL1 for changing the potential level of the control signal MOD or the operation mode. A signal pad 21 and a control signal generator 22 are incorporated in the mode changer 18. The signal pad 21 is located at a certain area under a void space not available for an assemblage of the commercial product. The void space is spaced from the lead terminals connected to the bonding pads 13 to 14, 15 to 16, 19 and 20, and bonding wires can not connect the bonding pad 21 to the lead terminals. Even if a bonding wire is connected to the bonding pad 21, the bonding wire only crosses the other bonding wires connected to the other bonding pads without short circuit.

Figure 3:
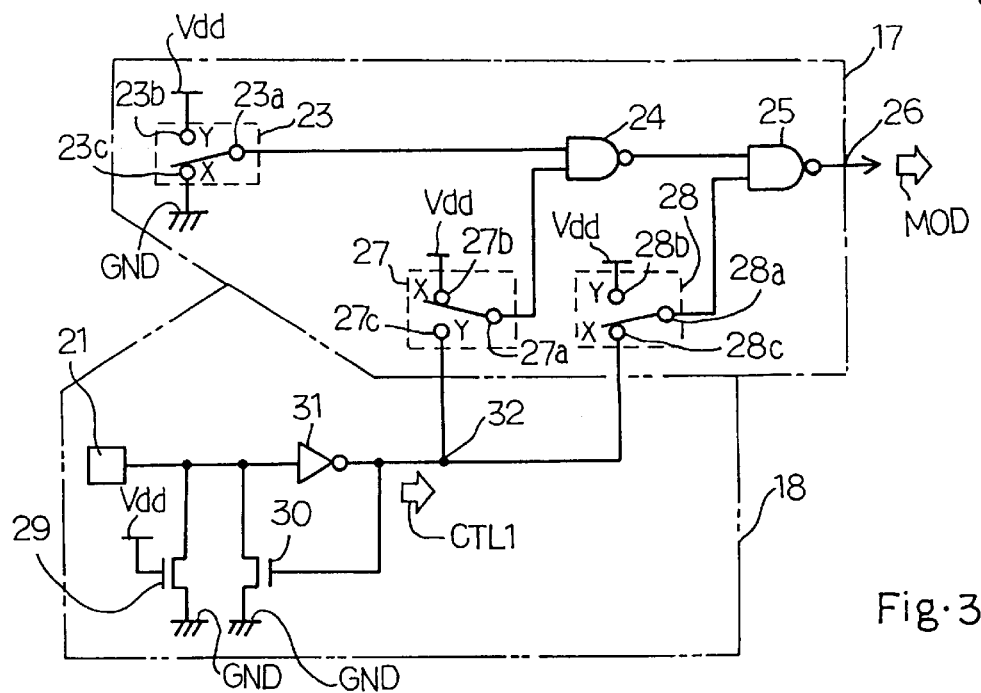
FIG. 3 is a circuit diagram showing the circuit configuration of a mode selector and a temporary mode changer incorporated in the semiconductor integrated circuit device.

Turning to FIG. 3, the mode selector 17 includes a first master-slice switching unit 23, NAND gates 24 and 25 connected in series between the first master-slice switching unit 23 and an output node 26, a second master-slice switching unit 27 associated with the NAND gate 24 and a third master-slice switching unit 28 associated with the other NAND gate 25. The control signal MOD is supplied from the output node of the NAND gate 25 to the output node 26. The first master-slice switching unit 23 has an output node 23a and input nodes 23c and 23b connected to the power supply line Vdd and the ground line GND, respectively, and the output node 23a is selectively connected to the input nodes 23b/23c through diffusing steps carried out on the master slice 11. One of the positive power potential Vdd and the ground potential is supplied from the associated input nodes 23b/23c to the output node 23a, and the positive power potential Vdd or the ground potential is supplied from the first master-slice switching unit 23 to the NAND gate 24 so as to determine the potential level of the control signal MOD for the commercial product.

The second master-slice switching unit 27 and the third master-slice switching unit 28 are used for changing the potential level of the control signal MOD in the evaluation. The second master-slice switching unit 27 also has an output node 27a and two input nodes 27b and 27c. The output node 27a is connected to the input node of the NAND gate 24, and the input nodes 27b/27c are connected to the power supply line Vdd and the mode changer 18, respectively. Similarly, the third master-slice switching unit 28 has an output node 28a and two input nodes 28b/28c. The output node 28a is connected to the input node of the NAND gate 25, and the input nodes 28b/28c are also connected to the power supply line Vdd and the mode changer 18 respectively. The output nodes 27a/28a are selectively connected to the associated input nodes 27b/27c and 28b/28c through diffusing steps carried out on the master slice 11, and the connections of the second/third master-slice switching units 27/28 are dependent on the connection of the first master-slice switching unit 23. Thus, the connections of the first, second and third master-slice switching units 23/27/28 are determined during a fabrication process for the semiconductor integrated circuit device, and the main circuit 12, the mode selector 17 and the mode changer 18 are completed before separation of the semiconductor chip 10 from the master slice 11.

When the first master-slice switching unit 23 supplies the ground potential GND to the NAND gate 24, the second master-slice switching unit 27 supplies the positive power potential Vdd to the NAND gate 24, and the third master-slice switching unit 28 connects the mode changer 18 to the NAND gate 25 so as to transfer the control signal CTL1 thereto. On the other hand, when the first master-slice switching unit 23 supplies the positive power potential Vdd to the NAND gate 24, the third master-slice switching unit 28 supplies the positive power potential Vdd to the NAND gate 25, and the second master-slice switching unit 27 connects the mode changer 18 to the NAND gate 24 so as to transfer the control signal CTL1 thereto. Thus, all the master-slice switching units 23, 27 and 28 are concurrently changed to one of "X" and "Y".

Each of the master-slice switching units 23/27/28 is implemented by a piece of conductive metal connected between the input signal line to the NAND gate 24/25 and either ground or positive power supply line.

The mode changer 18 includes n-channel enhancement type switching transistors 29/30 connected in parallel between the bonding pad 21 and the ground line GND and an inverter 31 connected between the bonding pad 21 and an output node 32. The n-channel enhancement type switching transistor 29 has a gate electrode connected to the power supply line Vdd, and the output node 32 is connected to the gate electrode of the other n-channel enhancement type switching transistor 30.

When the bonding pad 21 is in open state or supplied with the ground level, the n-channel enhancement type switching transistor 29 turns on, and the ground potential is supplied through the n-channel enhancement type switching transistor 29 to the input node of the inverter 31. The inverter 31 produces the control signal CTL1 of the high level, and the control signal CTL1 causes the n-channel enhancement type switching transistor 30 to turn on so as to fix the control signal CTL1 to the high level. In this situation, the mode selector 17 shown in FIG. 3 produces the control signal MOD of the low level.

On the other hand, when the positive power potential Vdd is supplied to the bonding pad 21, the n-channel enhancement type switching transistor 29 turns off, and the positive power potential Vdd is supplied to the input node of the inverter 31. The inverter 31 changes the control signal CTL1 to the low or ground level, and the control signal CTL1 causes the n-channel enhancement type switching transistor 30 to turn off. As a result, the control signal CTL1 is fixed to the low level. Although the master-slice switching units 23, 27 and 28 are not changeable on the master-slice after device fabrication, bonding pad 21 allows the control signal CTL1 to be changed, for example, from a level HI to a level LOW. Thus, the control signal CTL1 changes the potential to the master-slice switching units 27 and 28 and, accordingly, the potential levels at the input nodes of the NAND gates 24/25. In this situation, the mode selector 17 shown in FIG. 3 produces the control signal MOD of the high level.

Figure 4:
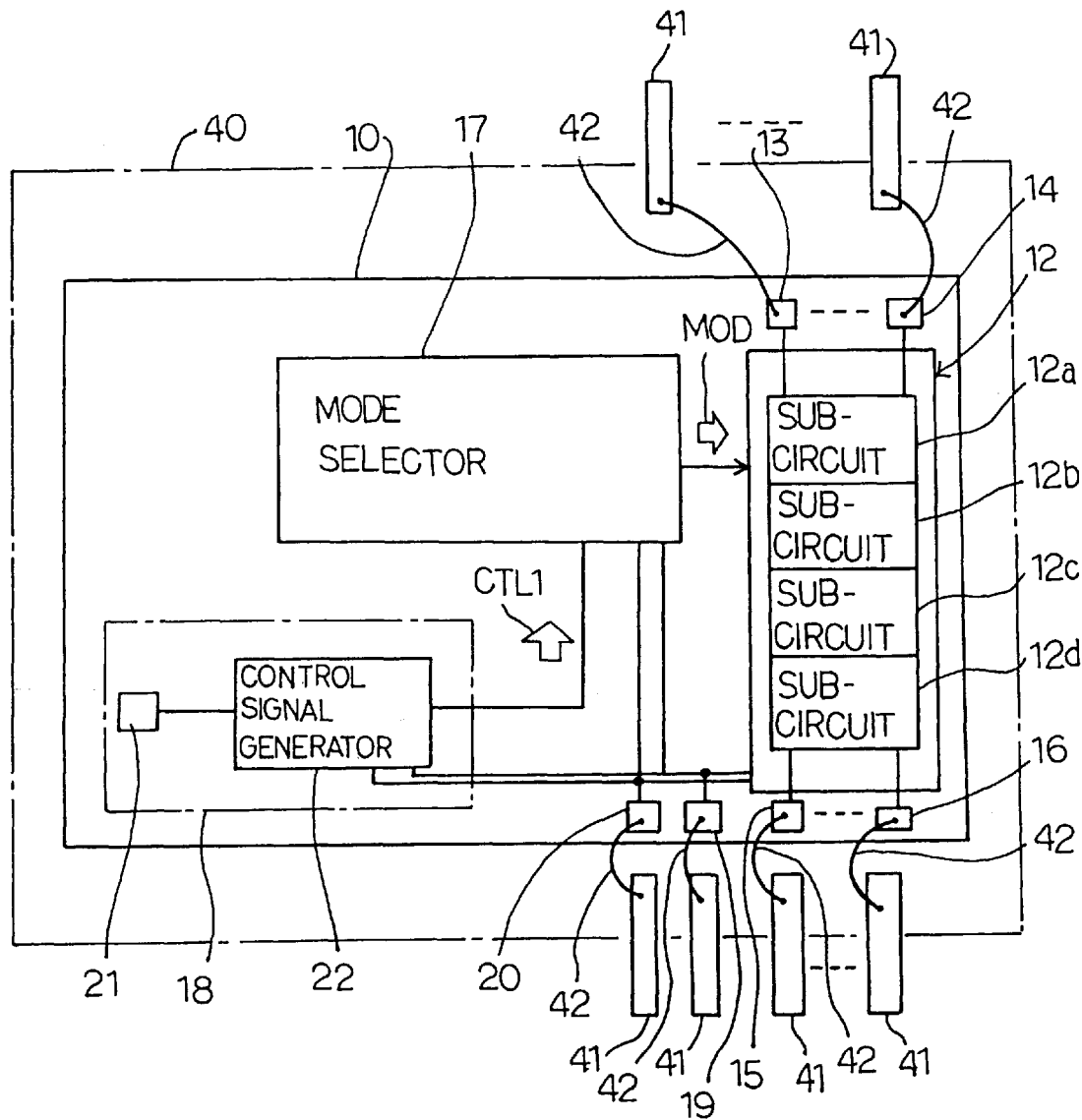
FIG. 4 is a schematic view showing the semiconductor integrated circuit device sealed in a package for a commercial use.
Figure 5:
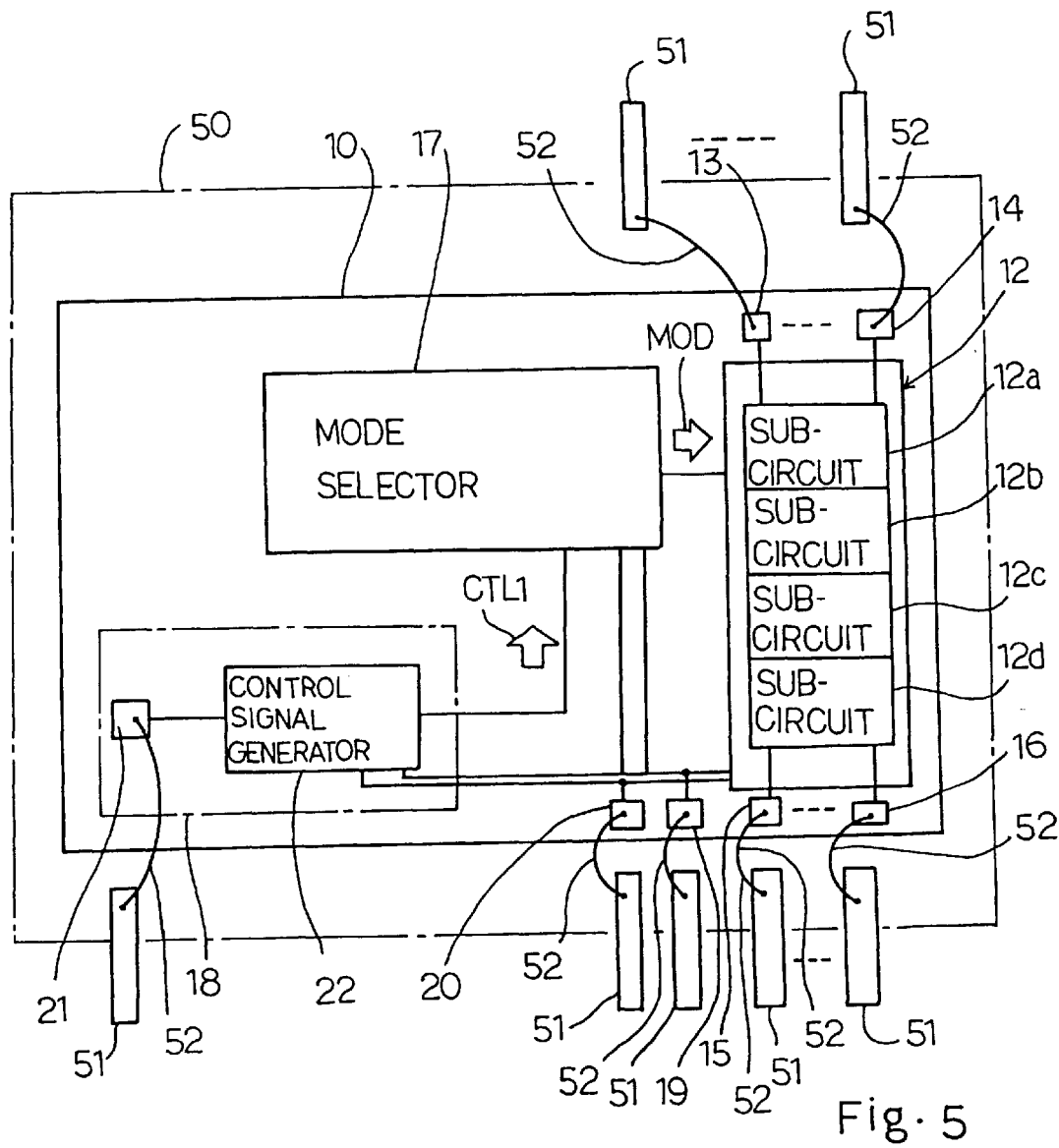
FIG. 5 is a schematic view showing the semiconductor integrated circuit device accommodated in a package for an evaluation use.

Two kinds of packages 40 and 50 are prepared for the semiconductor chip 10 as shown in FIGS. 4 and 5. The first package 40 is used for the commercial product, and the bonding pads 13 to 14, 15 to 16, 19 and 20 are connected to the terminals 41 of the first lead frame through bonding wires 42. Any lead terminal is never connected to the bonding pad 21, and is open in the first package.

The second package 50 is used for an evaluation of the semiconductor chip 10, and may be a ceramic package with a large number of terminals. Not only the bonding pads 13 to 14, 15 to 16, 19 and 20 but also the bonding pad 21 are connected to the lead terminals 51 of the second package through bonding wires 52. A testing system (not shown) supplies the positive power potential Vdd or the ground potential through the second package 50 to the bonding pad 21, and changes the operation mode of the main circuit 12. The testing system further supplies test signals to the input signal pads 13 to 14, and checks the output signals at the output signal pads 15 to 16 to see whether or not a malfunction takes place in one of the operation modes.

Assuming now that the manufacturer sets the first master-slice switching unit 23, the second master-slice switching unit 27 and the third master-slice switching unit 28 at the position shown in FIG. 3, the mode selector 17 can produce the control signal MOD of the low level. The manufacturer separates the master slice 11 into the semiconductor chips 10, and evaluates the semiconductor integrated circuit device through different operation modes. The manufacturer mounts the semiconductor chip 10 on the second package 50 for the evaluation use, and connects not only the bonding pads 13–14, 15–16, 19 and 20 but also the bonding pad 21 to the lead terminals 51 of the second package 50 through bonding wires 52. The bonding wire 52 to the pad 21 is not an obstacle to the other bonding wires 52 between the lead terminals 51 and the bonding pads 13–14, 15–16, 19 and 20, and the other bonding wires 52 are never mistakenly connected between the lead terminals and the bonding pad 21.

The manufacturer sets the second package 50 onto the testing system (not shown), and the testing system supplies the ground level to the bonding pad 21. The mode changer 18 supplies the control signal CTL1 of the high level to the second master-slice switching unit 27 and the third master-slice switching unit 28, and the second master-slice switching unit 27 and the third master-slice switching unit 28 supply the positive power potential Vdd to the NAND gates 24/25. The NAND gate 24 is enabled with the positive power potential Vdd, and inverts the potential level supplied from the first master-slice switching unit 23. The output node of the NAND gate 24 is at the positive power potential Vdd. The other NAND gate 25 is also enabled with the positive power potential Vdd supplied from the third master-slice switching unit 28, and inverts the potential level at the output node of the NAND gate 24. For this reason, the control signal MOD is at the ground level, and certain sub-circuits forms the electric circuit matched with the customer's specification. The testing system supplies a test pattern to the bonding pads 13 to 14, and checks the output signals to see whether or not the electric circuit correctly behaves.

Subsequently, the testing system supplies the positive power potential Vdd to the bonding pad 21. The mode changer 18 supplies the control signal CTL1 of the ground level to the second master-slice switching unit 27 and the third master-slice switching unit 28, and the second master-slice switching unit 27 and the third master-slice switching unit 28 connect the input nodes 27c/28b to the output nodes 27a/28a, respectively. For this reason, the second master-slice switching unit 27 and the third master-slice switching unit 28 supply the ground level and the positive power potential Vdd to the NAND gates 24/25, respectively. The NAND gate 24 produces the positive power potential Vdd at the output node thereof, and the positive power potential Vdd enables the NAND gate 25. The other NAND gate 25 inverts the potential level supplied from the third master-slice switching unit 28, and changes the control signal MOD to the positive power level Vdd. The control signal MOD of the high level differently activates the sub-circuits, and the subcircuits forms another electric circuit. Thus, the main circuit 12 behaves in another operation mode. The testing system supplies a test pattern to the bonding pads 13 to 14, and checks the output signals to see whether or not the electric circuit correctly behaves.

After the evaluation, the manufacturer mounts the other semiconductor chips 10 on the first packages 40 for the commercial use. The bonding pads 13–14, 15–16, 19 and 20 are connected to the lead terminals 41 of the first package through the bonding wires 42. However, the manufacturer does not connect the bonding pad 21 to any lead terminal 41, and keeps the bonding pad 21 open. While the bonding machine (not shown) is selectively connecting the bonding pads 13–14, 15–16, 19 and 20 to the lead terminals, the bonding machine never mistakenly connects the lead terminals 41 to the bonding pad 21, because the bonding pad 21 is sufficiently spaced from the lead terminals.

In this situation, the control signal CTL1 is fixed to the high level, and the mode selector 17 supplies the control signal MOD of the low level to the main circuit 12. For this reason, the semiconductor integrated circuit device behaves in the operation mode specified by the customer.

As will be appreciated from the foregoing description, the manufacturer can change the operation mode of the semiconductor integrated circuit device by using the bonding pad 21. The mode changer 18 requires only two field effect transistors 29/30 and only one inverter 31, and occupies narrow real estate. For this reason, the mode changer 18 does not enlarge the semiconductor chip 10.

Moreover, bonding wire is not connected to the bonding pad 21 in the package for the commercial use, and the bonding pad 21 is sufficiently spaced from the lead terminals. For this reason, the positive power voltage is never applied to the bonding pad 21 in the package for the commercial use, and the semiconductor integrated circuit device does not unintentionally change the selected operation mode.

The operation mode is simply changed by applying a different potential level to the bonding pad 21, and the mode changing technology according to the present invention is economical.

Although a particular embodiment of the present invention has been shown and described, it will be obvious to those skilled in the art that various changes and modifications may be made without departing from the spirit and scope of the present invention.

For example, the ground potential may be supplied to the bonding pad 21 after the test.

The semiconductor chip 10 may be evaluated without the second package for the evaluation use. In other words, the testing system may directly connect the probes to the bonding pads.

What is claimed is:

1. A semiconductor integrated circuit device having a plurality of operating states, wherein a default operating state is set during the fabrication process and a remainder of operating states are selectively activated through application of an instruction signal, said semiconductor integrated circuit device, comprising:

a main circuit, formed in a first area of said semiconductor chip, having a plurality of sub-circuits which are selectively activated by a first control signal to form an electric circuit from said plurality of sub-circuits;

a plurality of input signal pads formed in said first area and connected to said main circuit so as to supply an input signal to said main circuit;

a plurality of output signal pads formed in said first area and connected to said main circuit so as to provide an output signal from said main circuit;

a mode selector formed within said first area and having a plurality of master switches therein, each of said master switches being set to a pre-determined position for receiving at least one of a potential level and a second control signal in order to maintain the default operating state, and wherein a value of the second control signal determines the operating state of said mode selector, changing said first control signal outputted from said mode selector to selectively activate said sub-circuits; and a mode changer formed in a second area, comprising an input signal pad formed in the second area of said semiconductor chip and a control signal generator which is connected between said input signal pad of said second area and said mode selector of said first area, wherein said control signal generator receives an instruction of a potential level to produce said second control signal outputted to said mode selector, said second control signal being selectable and said master switches being set to cause said mode selector to output the first control signal having different values which correspond to different operating states.

2. The semiconductor integrated circuit device as set forth in claim 1, wherein said mode changer includes a bonding pad for receiving said instruction from said external source.

3. The semiconductor integrated circuit device as set forth in claim 1, wherein said input signal pad formed in a second area of said semiconductor chip receives a potential signal representative of said instruction.

4. The semiconductor integrated circuit device as set forth in claim 3, further comprising an electrically connecting element for connecting said input signal pad of said second area to a source of said potential signal.

5. The semiconductor integrated circuit device as set forth in claim 3, further comprising a package which seals said semiconductor chip therein, said package having a plurality of conductive terminals selectively connected to said plurality of input signal pads of first area and electrically isolated from said input signal pad of said second area.

6. A semiconductor integrated circuit device having a plurality of operating states, wherein a default operating state is set during the fabrication process and a remainder of operating states are selectively activated through application of an instruction signal, said semiconductor integrated circuit device, comprising;

a main circuit, formed in a first area of said semiconductor chip, having a plurality of sub-circuits which are selectively activated by a first control signal to form an electric circuit from said plurality of sub-circuits;

a plurality of input signal pads formed in said first area and connected to said main circuit so as to supply an input signal;

a plurality of output signal pads formed in said first area and connected to said main circuit so as to provide an output signal;

a mode selector formed within said first area, which receives a second control signal at a plurality of inputs and outputs said first control signal, wherein said first control signal selectively activates said sub-circuits; and a mode changer formed in a second area, and comprising an input signal pad formed in the second area of said semiconductor chip and a control signal generator connected between said input signal pad of said second area and said mode selector of said first area, and outputs the second control signal to said mode selector, said input signal pad formed in the second area of said semiconductor chip for receiving a potential signal representative of said instruction, wherein said control signal generator further comprises:

a first switching unit, connected between said input signal pad of said second area and a source of first potential level, which receives said potential signal from said input signal pad of said second area and generates a corresponding potential level; and a clamping circuit, connected between said input signal pad of said second area and a control node, which produces said second control signal in response to said potential signal.

7. The semiconductor integrated circuit device as set forth in claim 6, wherein said first switching unit further comprises a first field effect transistor connected between said input signal pad of said second area and said source of first potential level, having a gate electrode connected to a source of second potential level to maintain said input signal pad of said second area at one of said first potential level or said second potential level; and wherein said clamping circuit further comprises:
an inverter having an input node connected to said input signal pad of said second area; and
a second field effect transistor connected between said input node of said inverter and said source of first potential level, and having a gate electrode connected to an output node of said inverter, said second control signal being produced at said output node of said inverter.

8. A semiconductor integrated circuit device having a plurality of operating states, wherein a default operating state is set during the fabrication process and a remainder of operating states are selectively activated through application of an instruction signal, said semiconductor integrated circuit device, comprising:
a main circuit, formed in a first area of said semiconductor chip, having a plurality of sub-circuits which are selectively activated by a first control signal so as to form an electric circuit from said plurality of sub-circuits;
a plurality of input signal pads formed in said first area and connected to said main circuit so as to supply an input signal;
a plurality of output signal pads formed in said first area and connected to said main circuit so as to provide an output signal;
a mode selector formed within said first area, which produces said first control signal to selectively activate said sub-circuits, and which is responsive to a second control signal for changing said first control signal; and
a mode changer, connected to said mode selector, which is responsive to an instruction supplied from an external source so as to supply said second control signal to said mode selector,
wherein said mode selector further comprises:
a first master-slice switching unit having an output node selectively connected to a source of first potential level or a source of second potential level;
a first logic circuit having a first input node connected to said output node of said first master-slice switching unit, a second input node and an output node;
a second logic circuit having a first input node connected to said output node of said first logic circuit, a second input node and an output node producing said first control signal;
a second master-slice switching unit having an output node selectively connected to said source of second potential level or a control node; and
a third master-slice switching unit having an output node selectively connected to said source of second potential level or said control node in a complementary manner to said second master-slice switching unit.

9. A semiconductor integrated circuit device having a plurality of operating states, wherein a default operating state is set during the fabrication process and a remainder of operating states are selectively activated through application of an instruction signal, said semiconductor integrated circuit device, comprising:
a main circuit, formed in a first area of said semiconductor chip, having a plurality of sub-circuits which are selectively activated by a first control signal to form an electric circuit from said plurality of sub-circuits;
a plurality of input signal pads formed in said first area and connected to said main circuit so as to supply an input signal;
a plurality of output signal pads formed in said first area and connected to said main circuit so as to provide an output signal;
a mode selector formed within said first area, which receives a second control signal at a plurality of inputs and outputs said first control signal, wherein said first control signal selectively activates said sub-circuits; and
a mode changer formed in a second area, and having an input signal pad formed in a second area of said semiconductor chip and a control signal generator connected between said input signal pad of said second area and said mode selector of said first area, and outputs the second control signal to said mode selector, wherein said input signal pad formed in a second area of said semiconductor chip receives a potential signal representative of said instruction,
wherein said control signal generator comprises:
a first switching unit, connected between said input signal pad of said second area and a source of first potential level, which receives said potential signal from said input signal pad of said second area and generates a corresponding potential level;
a clamping circuit, connected between said input signal pad of said second area and a control node, which produces said second control signal in response to said potential signal; and
wherein said mode selector further comprises:
a first master-slice switching unit having an output node selectively connected to said source of first potential level or a source of second potential level;
a first logic circuit having a first input node connected to said output node of said first master-slice switching unit, a second input node and an output node;
a second logic circuit having a first input node connected to said output node of said first logic circuit, a second input node and an output node producing said first control signal;
a second master-slice switching unit having an output node selectively connected to said source of second potential level or said control node; and
a third master-slice switching unit having an output node selectively connected to said source of second potential level or said control node in a complementary manner to said second master-slice switching unit.

10. The semiconductor integrated circuit device as set forth in claim 9, further comprising a package for sealing said semiconductor chip therein, wherein said package has a plurality of conductive terminals selectively connected to said plurality of input signal pads of said first area and electrically isolated from said input signal pad of said second area.

11. The semiconductor integrated circuit device as set forth in claim 9, wherein said semiconductor chip is housed in a package, said package having a plurality of conductive terminals selectively connected to said plurality of input signal pads of said first area and said input signal pad of said second area to enable testing of said electric circuit and another electric circuit configuration implemented by activating other sub-circuits selected from said plurality of sub-circuits by changing said first control signal.

* * * * *